United States Patent
Takla

[19]

[11] Patent Number: 5,978,425
[45] Date of Patent: *Nov. 2, 1999

[54] HYBRID PHASE-LOCKED LOOP EMPLOYING ANALOG AND DIGITAL LOOP FILTERS

[75] Inventor: Ashraf K. Takla, San Jose, Calif.

[73] Assignee: Hitachi Micro Systems, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/863,039

[22] Filed: May 23, 1997

[51] Int. Cl.⁶ .................................................. H03D 3/24
[52] U.S. Cl. ......................... 375/374; 375/375; 375/376; 331/10; 327/159
[58] Field of Search ..................... 375/374, 376, 375/375, 371, 373; 331/1 A, 14, 10, 17, 1 R; 327/156, 157, 159

[56] References Cited

U.S. PATENT DOCUMENTS

| | | | |
|---|---|---|---|
| 4,316,152 | 2/1982 | Meyer | 331/1 A |
| 4,531,102 | 7/1985 | Whitlock et al. | 331/1 A |
| 4,737,866 | 4/1988 | Ebata | 360/51 |
| 5,097,489 | 3/1992 | Tucci | 375/120 |
| 5,334,952 | 8/1994 | Maddy et al. | 331/1 A |
| 5,422,760 | 6/1995 | Abbott et al. | 360/46 |
| 5,487,093 | 1/1996 | Adresen et al. | 375/376 |
| 5,555,276 | 9/1996 | Koenck et al. | 375/303 |
| 5,572,167 | 11/1996 | Alder et al. | 331/2 |
| 5,579,352 | 11/1996 | Llewellyn | 375/376 |
| 5,602,884 | 2/1997 | Wieczorkiewicz et al. | 375/376 |
| 5,663,945 | 9/1997 | Hayashi et al. | 369/124 |
| 5,699,387 | 12/1997 | Seto et al. | 375/376 |
| 5,757,238 | 5/1998 | Ferraiolo et al. | 331/1 A |

OTHER PUBLICATIONS

Chapter 3 entitled "The Classical Digital PLL (DPLL)" in book entitled *Phase–Locked Loops; Theory, Design, and Applications* by Roland E. Best published by McGraw–Hill, Inc., 1993©.

*Primary Examiner*—Stephen Chin
*Assistant Examiner*—Lenny Jiang
*Attorney, Agent, or Firm*—Graham & James LLP

[57] ABSTRACT

The invention provides a hybrid phase-locked loop (PLL) containing digital and analog portions for digital and analog adjustments, respectively, of an output signal. The hybrid PLL is simple in design. Off-the-shelf controlled oscillators, such as a current controlled oscillator (CCO) can be used with this hybrid PLL. The digital and the analog portions of the hybrid PLL are separate from the controlled oscillator. The digital portion is for a first adjustment of the frequency of the output signal, such as during a calibration. The analog portion is for fine phase and frequency adjustment of the output signal.

20 Claims, 7 Drawing Sheets it is located. This environmental noise may introduce a significant error into the recovered clock signal 136. The size of the noise error depends in part on the gain of the VCO 130. The larger the gain of the VCO 130, the larger will be the environmental noise induced error in the recovered clock signal 136.

HYBRID PHASE-LOCKED LOOP EMPLOYING ANALOG AND DIGITAL LOOP FILTERS

This patent application is related to U.S. patent application Ser. No. 08/733,869 filed on Oct. 17, 1996 by Mr. Ashraf K. Takla entitled "Method and Apparatus for Fast Clock Recovery Phase-Locked Loop with Training Capability," which is hereby incorporated by reference.

BACKGROUND OF THE INVENTION

Phase-locked loops find many applications. Among them is their use for recovering a clock signal out of a data signal stream. FIG. 1 shows a phase-locked loop (PLL) 110. In PLL 110, data 114 is coupled to a pulse gate circuit 120 also known as a pulse removing circuit. The pulse gate circuit 120 is coupled to a phase-frequency detector 118. The phase-frequency detector 118 is coupled to a charge pump 122, which in turn is coupled to a loop filter 126. The loop filter is coupled to a voltage controlled oscillator (VCO) 130. A feedback link 146 connects the output of the VCO 130 to the phase-frequency detector 118, as shown in FIG. 1. The VCO 130 has an output 134 for coupling a recovered clock signal 136 to a memory 138. The data 114 also is coupled directly to the memory 138 via data link 142. The recovered clock signal 136 clocks data 114 into memory 138.

A typical application of the PLL 110 is in a hard disk drive system. In the standard hard disk drive system, data needs to be sent from a disk drive 150 to memory 138 of, for example, a microprocessor. An example of data sent from disk drive 150 is servo data. Servo data contains positioning information of a head of a disk drive 150 with respect to the disk of the disk drive 150.

Clock signal information associated with data 114 is embedded in the data signal 114. In fact, such clock information may be available from voltage transitions of the data signal 114. Transmitting clock information along with the data 114 on data signal link 154 obviates the need for an extra link for the clock signal. Sometimes, an extra link is not even available, as in the case of a serial link, such as an RS-232 (Recommended Standard-232) link. Whether data is sent over serial or parallel data channels, in synchronous systems, clock information is needed for receiving the data. So embedded clock signal information has to be recovered from the data 114. This clock recovery is performed by PLL 110. PLL 110 frequency and phase locks onto the embedded clock signal information.

To minimize frequency and phase errors between the actual clock signal and the recovered clock signal 136, the recovered clock signal 136 is fed back via feedback link 146 to the pulse gate circuit 120. The pulse gate circuit 120 passes through a VCO pulse every time it receives a pulse on data signal link 154. The pulse gate circuit 120 transmits the recovered clock signal 136 to the phase-frequency detector 118. The phase-frequency detector 118 minimizes phase and frequency differences between the clock signal associated with data 114 and the recovered clock signal 136. When the PLL 110 is in a locked state, then the phase and frequency error between the recovered clock signal 136 and the clock signal in the data 114 is small or zero.

The PLL 110 can lose lock. Loss of lock is the state of the PLL when the phase and/or frequency differences between the recovered clock signal 136 and the clock of the data signal 114 have become substantial. A loss of lock of PLL 110 can occur, for instance, when the loop filter 126 picks up electrical noise from the environment where the PLL 110 is located. This environmental noise may introduce a significant error into the recovered clock signal 136. The size of the noise error depends in part on the gain of the VCO 130. The larger the gain of the VCO 130, the larger will be the environmental noise induced error in the recovered clock signal 136.

The VCO 130 is an analog device. Consequently, the PLL 110 can achieve a high phase resolution of the recovered clock signal 136. However, typically analog adjustment of the phase and/or frequency of the recovered signal 136 is relatively slow. To increase the speed of adjusting the phase of the recovered clock signal 136, some PLL's 110 include a digital adjustment of the phase of the recovered signal 136 in addition to the analog adjustment. Digital adjustment by use of delay increment cells combined with analog adjustments may be utilized. The delay increment cells are part of a VCO. They provide initial digital adjustment of a signal at the output of the VCO. The delay increment cells are intended to provide for a relatively fast phase lock of a PLL. The circuit for the analog adjustment also is included in the same VCO. That circuit is for fine tuning of the phase of the signal at the VCO output. However, to double the precision of the digital adjustment, the number of delay increment cells would have to be doubled as well. Such doubling doubles the power consumption of the delay cells and will significantly enlarge the required area of the circuit.

Another drawback of the digital cell approach is that it requires a more complicated VCO design. Instead of being a standard device, such a VCO must be designed to include two tuning components: a digital component and an analog component. Typically more complicated designs result in greater expense, which results in overall a more expensive PLL. More complicated designs generally also are more prone to failures than simpler designs.

BRIEF SUMMARY OF THE INVENTION

The invention includes a hybrid phase-locked loop (PLL) with digital and analog portions for digital and analog adjustments, respectively, of an output signal. Off-the-shelf controlled oscillators, such as a current controlled oscillator (CCO) can be used with this hybrid PLL. The digital and the analog portions of the hybrid PLL may be separate from the controlled oscillator. The digital portion may be for a first adjustment of the frequency of the output signal, such as during a calibration. The analog portion is typically used for a fine adjustment of the output signal.

From a system standpoint, a preferred embodiment of the invention is a phase-locked loop comprising a detector and a digital loop filter coupled to the detector. The digital loop filter includes a successive approximation register. The phase-locked loop further comprises a digital-to-analog converter coupled to the digital loop filter and a variable oscillator coupled to the digital-to-analog converter. Further included is a filter coupled to the detector and to the controlled oscillator.

From a process standpoint, another preferred embodiment of the invention is a method for acquiring phase-lock. The method comprises the steps of coupling a data signal to a detector, coupling an output signal to the detector, and comparing the phase of the data signal with the phase of the output signal. The method further comprises the steps of generating a comparison signal based on the comparison of the data signal with the output signal, transforming the comparison signal into a successive digital approximation signal, and transforming the comparison signal into a fine adjustment signal.

DETAILED DESCRIPTION OF THE PREFERRED EMBODIMENTS

The invention includes a hybrid phase-locked loop (PLL) capable of making both phase and frequency adjustments. The PLL includes digital and analog portions for making digital and analog adjustments, respectively, of an output signal. Off-the-shelf controlled oscillators, such as a current controlled oscillator (CCO) can be used with this hybrid PLL. The digital and the analog portions of the hybrid PLL are separate from the controlled oscillator. The digital portion is for a first adjustment of the frequency of the output signal, such as during a calibration. The analog portion is for fine adjustment of the output signal.

The digital portion of the hybrid PLL includes a digital loop filter. The digital loop filter in turn includes a digital filter coupled to a successive approximation register (SAR). Having a successive approximation register (SAR) allows for precision digital phase and frequency control with relatively little hardware and thereby significant efficiency of performance. The analog portion is for fine tuning the output clock signal 238. Using the analog portion of the hybrid PLL only for fine tuning of the output signal permits a low noise performance of the hybrid PLL by limiting the analog portion to a relatively small signal gain.

Figure 1:
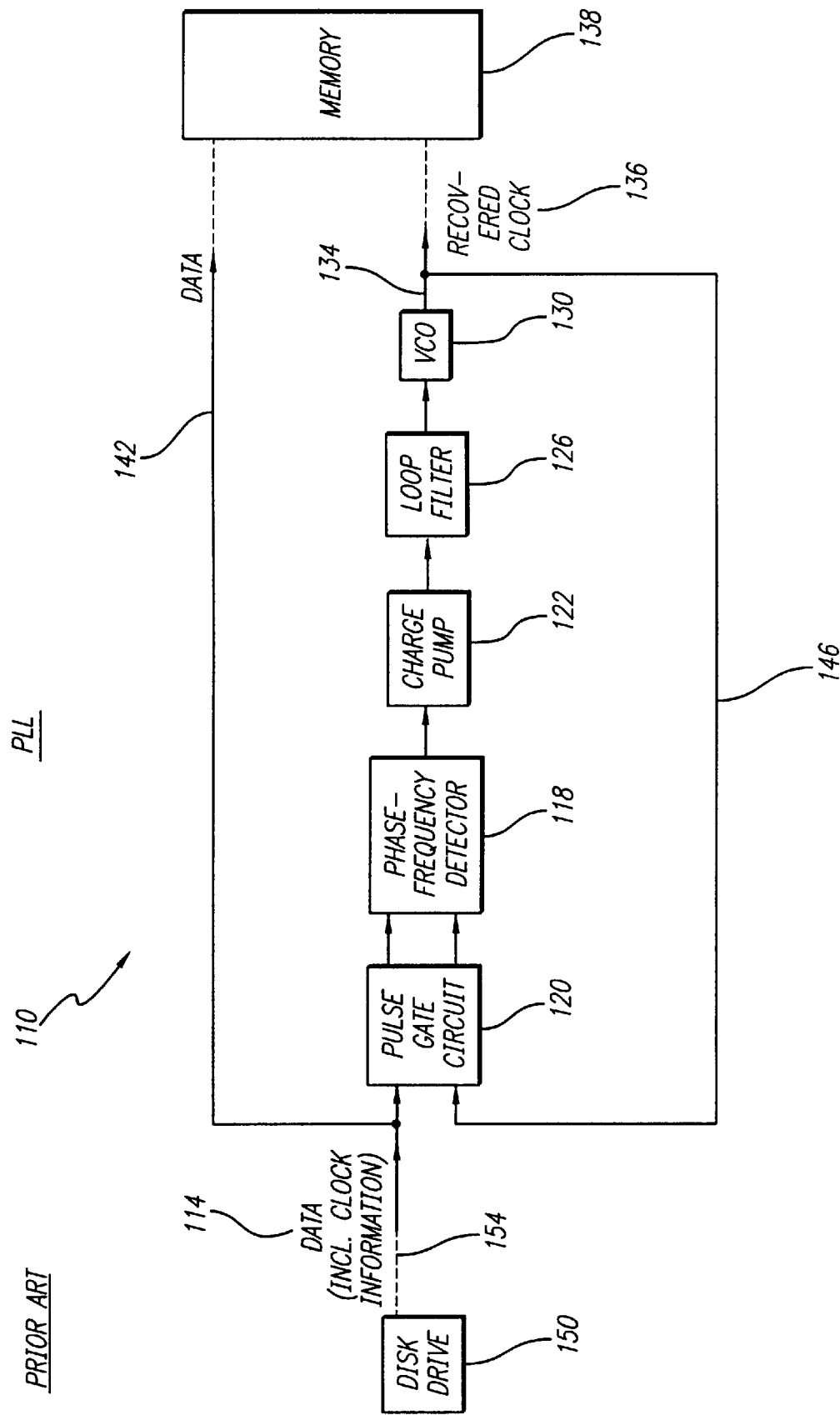
FIG. 1 is a block diagram of a phase-locked loop (PLL).
Figure 2:
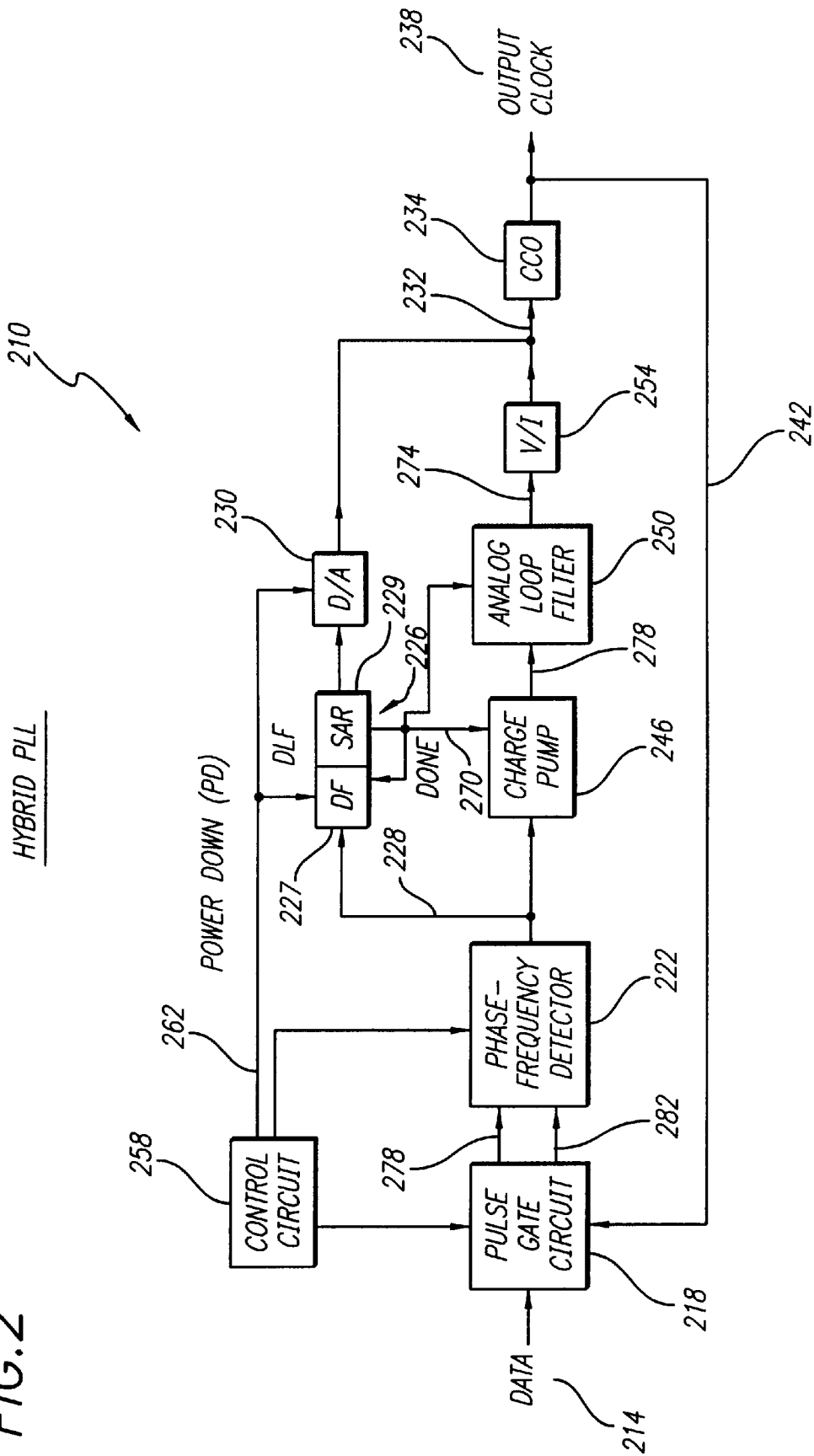
FIG. 2 is a block diagram of a hybrid PLL with digital and analog portions, in accordance with a preferred embodiment of the invention.

FIG. 2 is a block diagram of a hybrid PLL 210 with separate digital and analog portions. The following discusses the structure of the hybrid PLL 210 that processes a data signal 214. The data signal 214 includes embedded clock signal information. This clock signal information reflects the clock signal with which the data signal 214 is clocked from, for instance, disk drive 150 to memory 138 (see FIG. 1). Data signal 214 is input to a pulse gate circuit 218. The pulse gate circuit 218 is coupled to the phase-frequency detector 222. The phase frequency detector 222 is coupled to the digital as well as to the analog portions of the hybrid PLL 210, as discussed below.

The digital portion of the hybrid PLL 210 includes a digital loop filter (DLF) 226 coupled to a digital-to-analog converter 230. The digital loop filter 226 receives an input signal via link 228 from the phase-frequency detector 222, as indicated by the direction of the arrow head of link 228. Similarly, other arrow heads also indicate directions of signals. The digital loop filter 226 includes a digital filter (DF) 227 and a successive approximation register (SAR) 229. The digital loop filter 226 is coupled to the digital-to-analog converter 230. The digital-to-analog converter 230 is coupled to a summer 232. In FIG. 2, the summer is a simple wire node. Also connected to the wire node 232 is a current controlled oscillator (CCO) 234. The CCO 234 provides an output clock signal 238. A feedback link 242 is for feedback coupling of the output clock signal 238 to the pulse gate circuit 218.

As mentioned above, the phase-frequency detector 222 also is coupled to the analog portion of the hybrid PLL 210. The analog portion of the hybrid PLL 210 includes a charge pump 246 (coupled to the phase-frequency detector 222) coupled to an analog loop filter 250 coupled to a voltage-to-current converter 254. The voltage-to-current converter 254 is coupled to the wire node 232. The voltage-to-current converter 254 may be, for example, a field effect transistor (MOSFET).

The analog loop filter 250 is a passive device. It reduces phase jitters in the output clock signal 238. Instead of a charge pump 246 and passive analog loop filter 250 combination, an active analog loop filter can be used instead. An active analog loop filter typically includes one or more operational amplifiers, whereas the passive loop filter 250 includes only passive elements, such as resistors and capacitors. Based on the description herein, it will be clear to one of ordinary skill in the art that other configurations also can be used, such as a passive loop filter without a charge pump 246.

A control circuit 258 is coupled to the pulse gate circuit 218. The control circuit 258 also is coupled to the digital loop filter 226 as well as the digital-to-analog converter 230.

The hybrid PLL 210 functions as follows. To activate the hybrid PLL 210, the control circuit 258 provides a power down signal via power down link (PD) 262 to the digital loop filter 226 as well as to the digital-to-analog converter 230. The power down signal on power down link 262 activates the digital loop filter 226 as well as the digital-to-analog converter 230.

Upon activating the digital loop filter 226, initially the hybrid PLL 210 operates in a calibration mode, where only the digital portion of the hybrid PLL 210 is active. To disable the analog portion of the hybrid PLL 210 while the digital portion is operating, the successive approximation register 229 maintains a DONE signal low on DONE link 270. A low voltage, such as zero volts, on the DONE link 270 disables the charge pump 246 and the analog loop filter 250. Disabling the charge pump 246 freezes an output signal on link 274 in the middle of a voltage range capability of the voltage-to-current converter 254. This freezing enhances the flexibility of the hybrid PLL 210. Later when the digital portion of the hybrid PLL 210 is inactive and the analog portion is active, then the output voltage of the analog loop filter 250 can range equally in the positive or negative direction depending on the phase and frequency of the output clock signal 238.

In addition to activating the digital and analog portions of the hybrid PLL, the control circuit 258 also activates the pulse gate circuit 218 thereby transmitting the data signal 214 to the phase-frequency detector 222. The pulse gate circuit 218 eliminates the possible problem caused by skipped pulses in the data signal 214. Skipped or missing pulses can arise when the data signal 214 has, for instance, a series of logic zeros in between logic ones. In some formats, only logic ones are represented by low-high-low voltage transitions. Logic zeros are represented by no transitions at all.

Phase-frequency detectors 222 typically are unable to correctly compare frequencies and phases of two signals where one of the signals has skipped or missing pulses. The pulse gate circuit 218 compares the data signal 214 with the output clock signal 238 on feedback link 242. Further, it removes pulses from the output clock signal 238 at second input 282 to the phase-frequency detector 222, whenever there is no corresponding pulse present in the data signal 214.

The phase-frequency detector 222 compares the data signal 214 at a first input 278 with the output signal 238 as modified by the pulse gate circuit 218 at a second input 282. Based on the result of the comparison, the phase-frequency detector 222 provides an output signal to the digital loop filter 226 and to the charge pump 246. However, as mentioned above, initially the charge pump 246 is deactivated and consequently does not respond to the signal from the phase-frequency detector 222.

The output signal of the phase-frequency detector 222 has the effect of tending to reduce the frequency and phase differences at inputs 278 and 282 by adjusting the frequency of the output clock signal 238. The output signal of the phase-frequency detector 222 is a voltage signal that is a function of the difference in frequency and phase of the signals available at the first and second inputs 278, 282 of the phase-frequency detector 222.

The output signal of the phase-frequency detector 222 can have one of three states. The output signal is a voltage signal that will be at a high voltage level, such a five volts, when the signal at the first input 278 has a frequency greater than the frequency of the signal present at the second input 282. The length of time that the output voltage of phase-frequency detector 222 will be at the high voltage is proportional to the magnitude of the difference in frequencies of the signals present at the first and second inputs 278, 282.

When the frequencies and phases of the signals present at the first and second inputs 278, 282 are equal, then the phase-frequency detector 222 will provide an output signal of zero volts. Finally, when the frequency of the signal present at input 278 is less than the frequency of the signal at input 282, then the output signal of the phase-frequency detector 222 is a negative voltage. Similarly to the converse case, the duration of the negative output voltage signal of the phase-frequency detector 222 is proportional to the magnitude of the difference between the frequencies and phases of the signals present at inputs 278, 282. The duration of the output signal of the phase-frequency detector 222 is important for the functioning of the charge pump 246, as will become clear further below.

Phase differences of signals at one frequency at inputs 278, 282 have a similar effect on the output signal of the phase-frequency detector 222. Phase-frequency detectors are discussed in Chapter 3 entitled "The Classical Digital PLL (DPLL)" of the second edition of the book called *Phase-Locked Loops: Theory, Design, and Applications* by Roland E. Best, published by McGraw-Hill, Inc., 1993, which is hereby incorporated by reference.

The digital filter 227 accepts the output of the phase-frequency detector 222. The digital filter 227 counts the number of positive voltage pulses as well as the number of negative voltage pulses. As shown in greater detail below, the digital filter 227 supplies two signals, R (clock for SAR) and B (see FIGS. 3, 4, 5, and 6) to the successive approximation register 229 (see FIG. 5) discussed below.

The successive approximation register 229 processes the R and B signals to generate a digital signal for the digital-to-analog converter 230. This digital signal (316 in FIG. 3 and D3, D2, D1, D0 in FIG. 5) is such that at the end of the calibration, the frequency of the clock output signal 238 is close to the frequency of the data signal 214. The details of the digital filter 227 as well as those of the successive approximation register 229 are discussed further below.

In response to the digital signal D3, D2, D1, D0, the digital-to-analog converter 230 provides an output current to the current controlled oscillator 234. The output current of the digital-to-analog converter 230 can range, for instance, between 50 to 500 micro-amperes.

After the initial calibration in the digital mode, the hybrid PLL 210 switches to the analog mode. There the digital portion is disabled and the analog portion is enabled for fine tuning of the output clock signal 238. This disable/enable function is performed by the successive approximation register 229. Once the successive approximation register 229 has provided the digital-to-analog converter 230 with the complete digital signal D3, D2, D1, D0, then the successive approximation register 229 sends the DONE signal via DONE link 270 to the digital filter 227, the charge pump 246, and the analog loop filter 250. The DONE signal disables the digital filter 227 and enables the charge pump 246 and the analog loop filter 250. Consequently, the digital portion of the hybrid PLL 210 is disabled, whereas the analog portion of the hybrid PLL 210 is enabled. The phase-frequency detector 222 continues to provide its output signal.

The charge pump 246 converts the output voltage of the frequency detector 222 into a current. The analog loop filter 250 filters the current and transforms it into a voltage signal. This voltage signal of the analog loop filter 250 is converted by the voltage-to-current converter 254 into a current signal, which can range, for instance, up to 50 micro-amperes. This current signal controls the frequency of the output clock signal 238 of the CCO 234.

Figure 3:
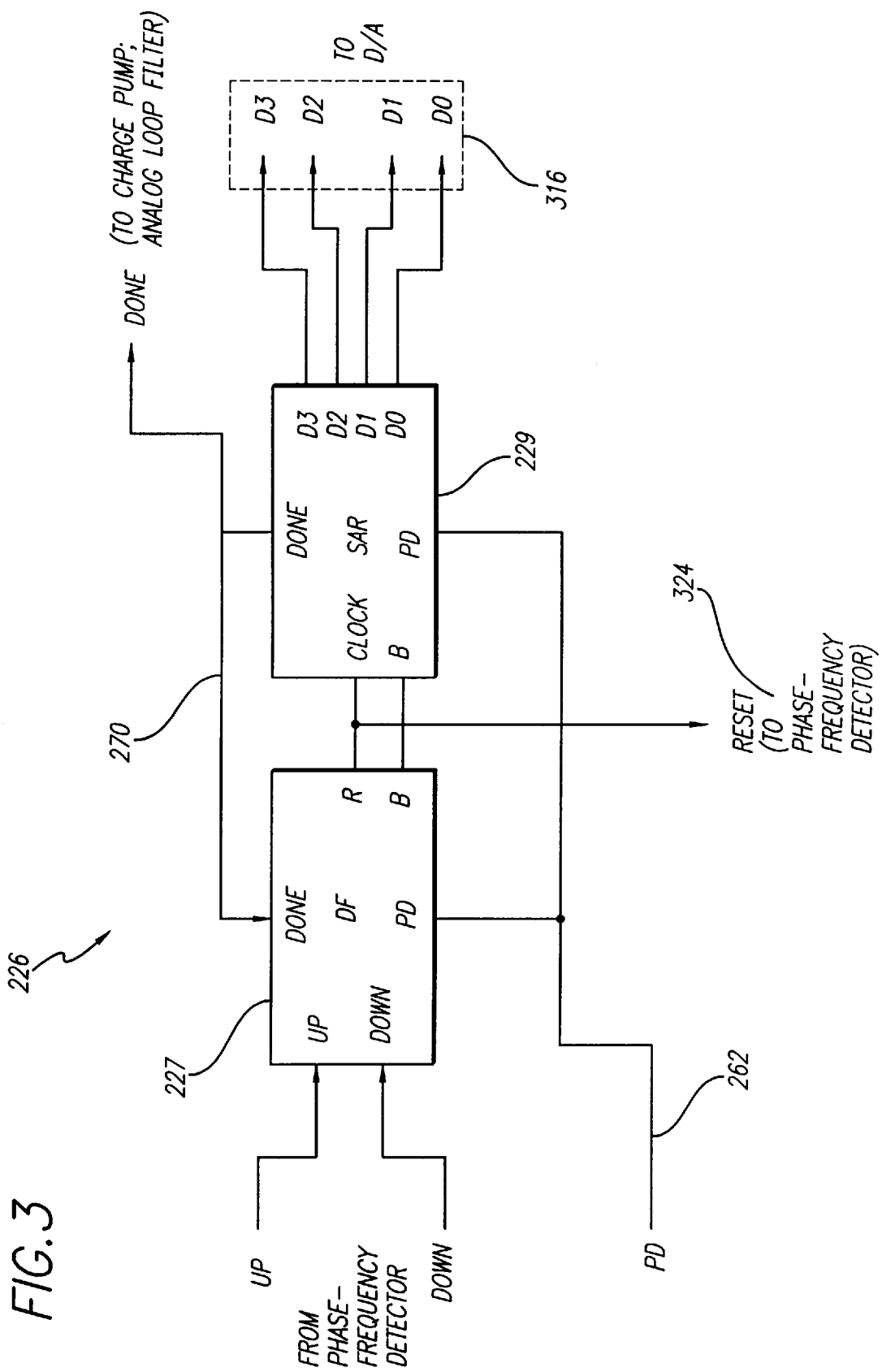
FIG. 3 is a more detailed block diagram of a digital loop filter of the embodiment of FIG. 2.

FIG. 3 shows the digital loop filter 226 in greater detail. The digital filter 227 of the digital loop filter 226 accepts the voltage signal from the phase-frequency detector 222. The positive voltage signal from the phase-frequency detector 222 corresponds to the UP signal in FIG. 3. Instead of a negative voltage signal, the phase-frequency detector 222 in FIG. 3 provides a positive DOWN signal as shown. The digital filter 227 processes the UP and DOWN signals and converts them into R and B signals for input to the successive approximation register 229, as discussed above. The successive approximation register 229 in turn provides, based on the R and B signals, the digital signal 316 including four bits, D3, D2, D1, and D0, as discussed above. The successive approximation register 229 provides the digital signal 316 to the digital-to-analog converter 230.

The digital loop filter 226 generates a reset signal 324 for coupling (not shown in FIG. 2) to the phase-frequency detector 222. As shown in FIG. 3, the reset signal 324 is the R signal (a pulse signal, as discussed further below) from the digital filter 227. Providing such a reset signal 324 to the phase-frequency detector 222 resets the phase-frequency detector 222 to an initial state, thereby ensuring that the phase-frequency detector 222 operates predictably. The reset signal 324 resets the phase-frequency detector 222 prior to each digital adjustment by the successive approximation register 229, as will become clear below.

Figure 4:
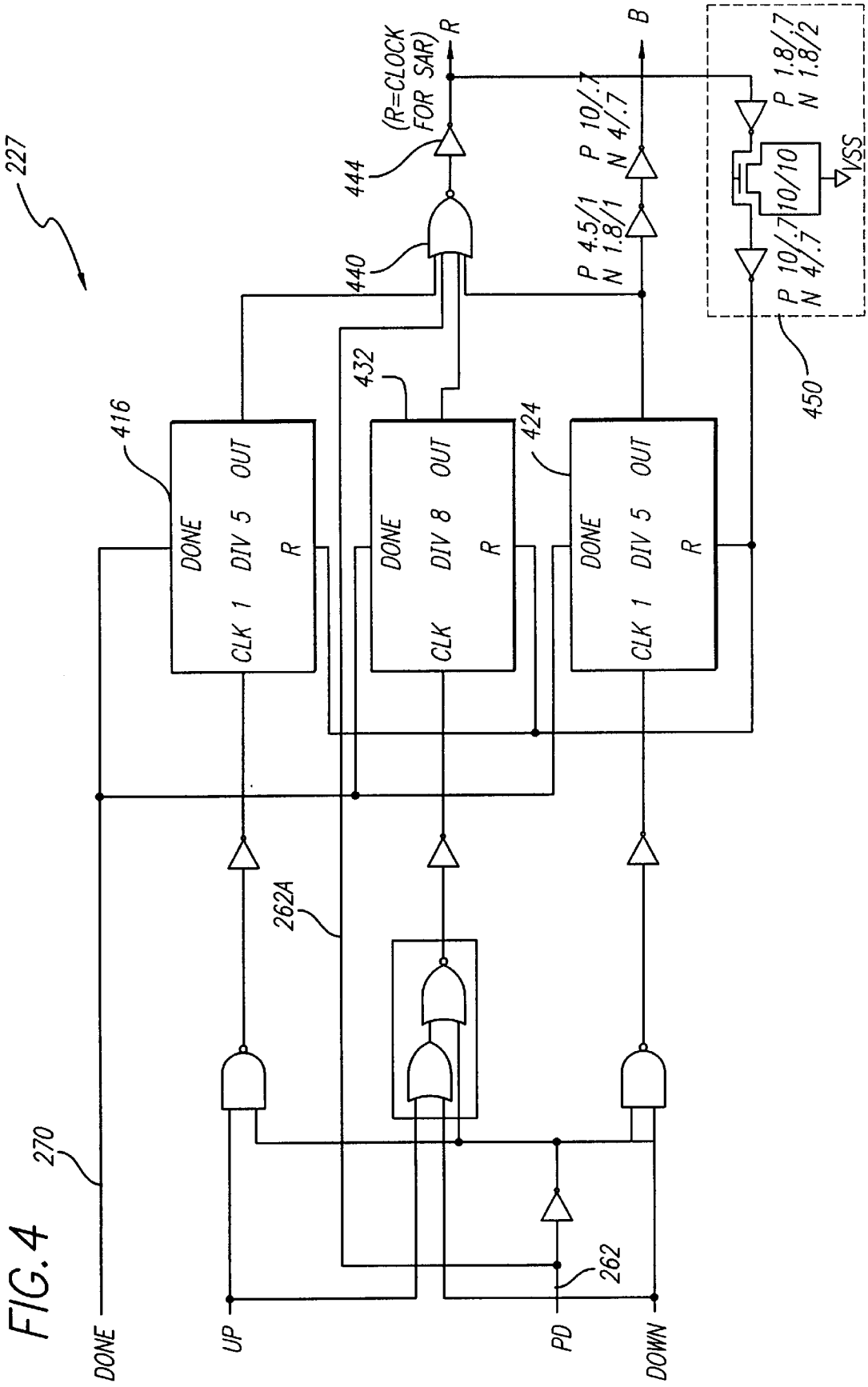
FIG. 4 is a circuit diagram of a digital filter of the digital loop filter of FIG. 3.

FIG. 4 shows details of the digital filter 227. The digital filter 227 functions as follows. Briefly, as part of the calibration, initially the digital filter 227 commands the successive approximation register 229 to cause an increase in the frequency of the output clock signal 238 (see FIG. 2). If this initial increase was too great, i.e., resulted in a frequency of the output clock signal 238 being significantly greater than the frequency of the data signal 214, then the digital filter 227 commands the successive approximation register 229 to cause the frequency of the output clock signal 238 to be reduced. Of course, the significance of a difference between the frequencies of the output clock and the data signals 238, 214 depends on the particular application of the hybrid PLL 210.

If after the initial increase, the frequency of the output clock signal 238 is significantly lower than that of the data signal 214, then the digital filter 227 commands the successive approximation register 229 to cause the frequency of the output clock signal 238 to increase further. If instead, however, the frequency of the output clock signal 238 is sufficiently close to that of the data signal 214, then the digital filter 227 still commands the successive approximation register 229 to cause the frequency of the output signal 238 to increase further. This above-described process of commanding by the digital filter 227 of the successive approximation register 229 repeats until the digital filter 227 has provided the complete digital signal 316 (see FIG. 3) to the successive approximation register 229.

In detail, initially the power down signal PD is at a high voltage (see FIG. 6), thereby disabling the hybrid PLL 210 including the digital filter 227, as is clear from FIG. 4, as well as the pulse gate circuit 218. The power down signal PD is coupled via link 262A, a logic NOR gate 440, and an inverter 444 to the output of the digital filter 227. Next, as discussed above, the control circuit 258 pulses the digital filter 227 on the power down link 262. The PD signal on pulse down link 262 is pulled from a high voltage to a low voltage (see FIG. 6), thereby resetting the counters in FIGS. 4 and the flip-flops in FIG. 5. Consequently, after a brief delay (not shown in FIG. 6), the R signal drops from a high voltage to a low voltage, as illustrated in FIG. 6 and discussed further below. Dropping the voltage level of the R signal sets the stage for a low-to-high voltage transition of the R signal thereby causing the successive approximation register 229 to obtain a first approximation of the digital signal D3, D2, D1, D0 for input to the digital-to-analog converter 230, as discussed further below.

Once the control circuit 258 has pulled low the power down signal PD, the digital filter 227 begins counting the number of UP and DOWN signals from the phase-frequency detector 222. Dividers 416 and 424 count the UP and DOWN signals, respectively. A divider 432 counts both UP and DOWN signals.

Each time that the dividers 416, 424 count five UP or five DOWN signals, respectively, from the phase-frequency detector 222, they generate a high voltage signal at their OUT ports. High voltage signals at the OUT ports generate a low-to-high voltage transition of the R signal, as shown in FIG. 6. Each such low-high voltage transition clocks the successive approximation register 229, also as shown in FIG. 6 and as further explained below.

However, the R signal remains only briefly at a high voltage level before dropping back to a low voltage level until the next low-to-high voltage transition for clocking the successive approximation register 229. The R signal drops back to a low voltage level because the R signal is coupled via a delay circuit 450 to reset ports R of dividers 416, 424, 432. The delay circuit 450 resets the dividers 416, 424, 432. The delay of the delay circuit 450 is sufficient for proper timing. In FIG. 4 as well as in other figures discussed herein, there are shown ratios of transistor channel widths to lengths. The associated letters P and N indicate the type of transistor used for the logic gates. The dimensions are in microns. So, for instance, the p-type transistor of one of the inverters in the delay circuit 450 has a channel width of 1.8 microns and a gate length of 0.7 microns.

Having been reset, the dividers pull low any high voltages at their respective OUT ports. To insure that dividers 416, 424 count five pulses within a total of eight pulses from the phase-frequency detector 222, divider 432 provides a high voltage at its OUT port for any sequence of eight UP and/or DOWN signals. Similarly to R signal pulses generated by counters 416, 424, a pulse generated by counter 432 also clocks the successive approximation register 226. Following the fifth R signal pulse, the successive approximation register 229 generates the DONE signal (see FIG. 6). As mentioned above, the DONE signal disables digital filter 227.

Figure 5:
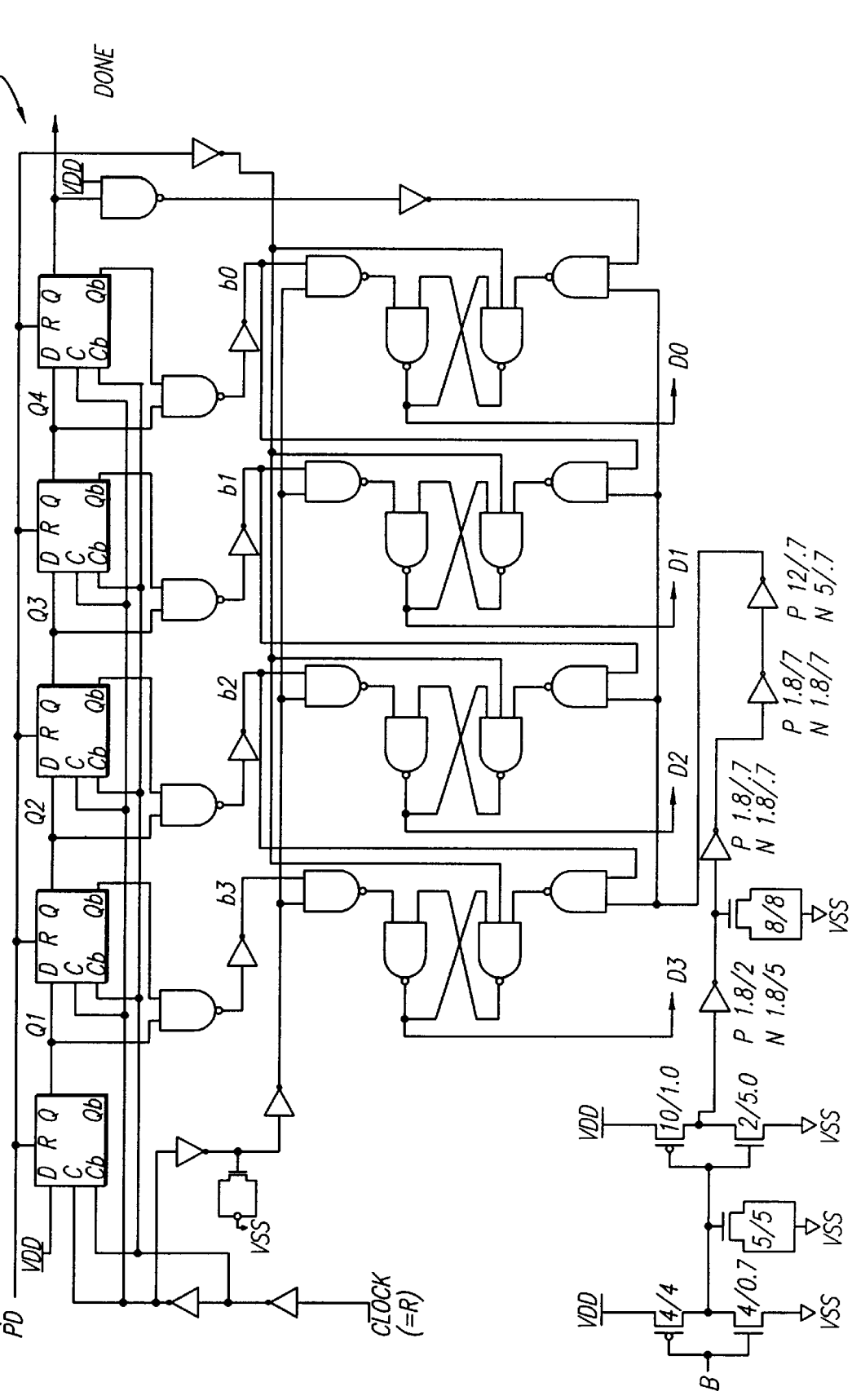
FIG. 5 is a circuit diagram of a successive approximation register of the digital loop filter of FIG. 3.
Figure 6:
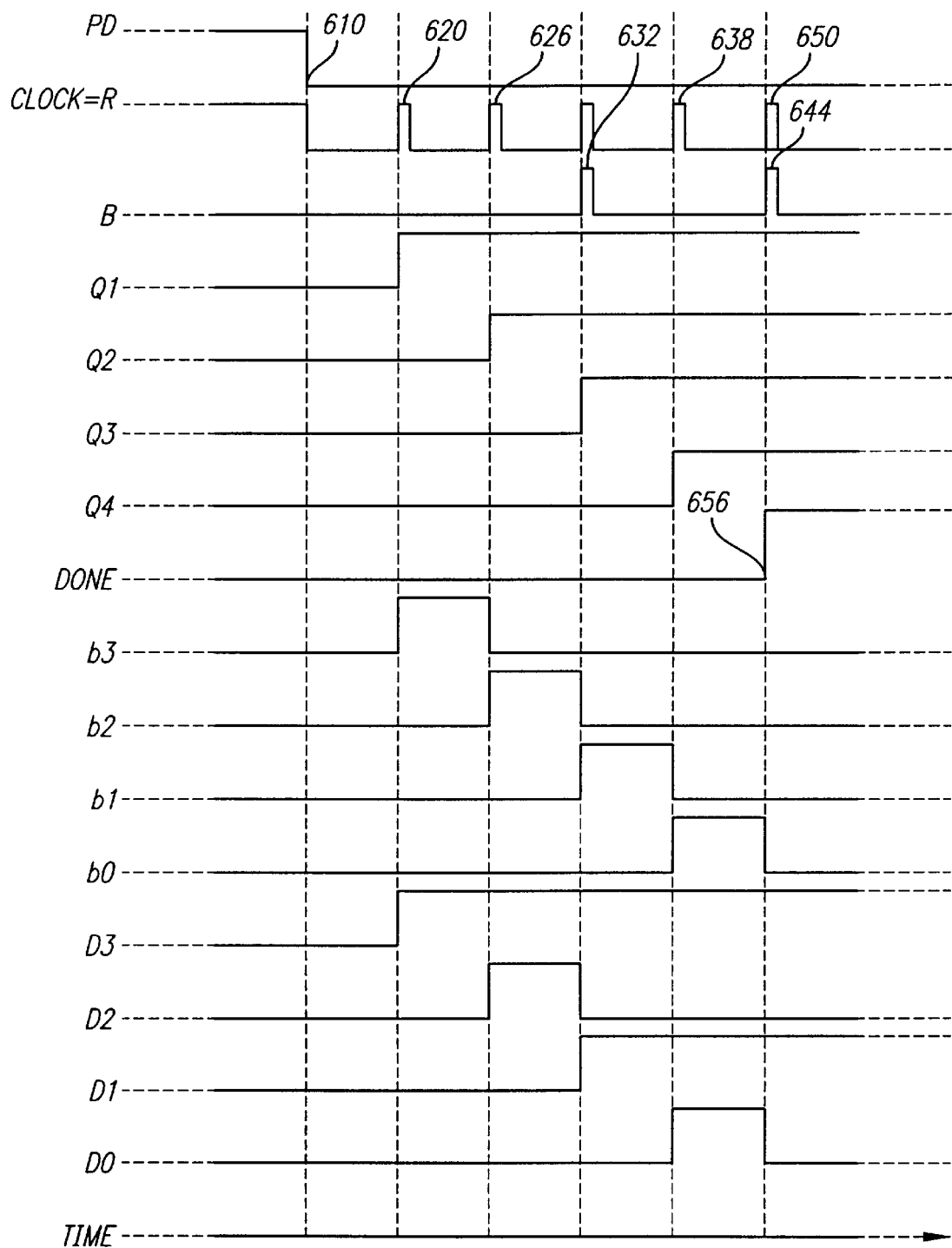
FIG. 6 is a timing diagram illustrating the timing of signals processed by the successive approximation register of FIG. 5.

FIG. 5 shows details of the successive approximation register 229. FIG. 6 is a timing diagram for the successive approximation register 229. The dashed horizontal lines in FIG. 6 indicate signal transitions occurring at approximately the same time. FIG. 6 illustrates the timing of the signals associated with the successive approximation register 229 in response to the following sequence of signals: a high-to-low PD signal transition; a first signal pulse on the OUT port of divider 416 generating an R signal pulse 620; a signal pulse on the OUT port of divider 416 generating an R signal pulse 626; a signal pulse at the OUT port of divider 424 generating a B signal pulse 632; a signal pulse at OUT port of divider 416 generating R signal pulse 638; and signal pulse at the OUT port of divider 424 generating B signal pulse 644. As explained above, each B signal pulse has a corresponding R signal pulse, as shown in FIG. 6.

As a result of the particular sequence of pulses generated by dividers 416 and 424 at their respective OUT ports, the successive approximation register 229 generates signals Q1, Q2, Q3 and Q4, which are output signals of the D-type flip-flops of the successive approximation register 229. (The particular D-type flip-flops in FIG. 5 use an inverted as well as non-inverted clock signal.) Using output signals Q1–Q4 in combination with the inverted output Qb signals of some of the D-type flip-flops results in signals b3, b2, b1, and b0, as shown in FIGS. 5 and 6.

The successive approximation register 229 uses signals b3–0 to generate the digital signal D3, D2, D1, D0 as shown in FIG. 6 for input to the digital-to-analog converter 230. A last R signal pulse 650 generates a low-to-high voltage transition of the DONE signal 656. This transition 656 of the DONE signal causes the digital filter 227 to freeze, as discussed above. In sum, the combination of the digital filter 227 with the successive approximation register 229 provides a four-bit digital signal D3, D2, D1, D0 with only five R signal pulses. At any time, should the hybrid PLL 210 lose lock due to, for instance, an extended interruption in the data signal 214, the control circuit 258 will pull high the power down signal PD. Thereafter, the hybrid PLL will reacquire phase/frequency lock by following the process described herein. In one embodiment, the microcompressor associated with memory 138, upon failing to receive data 214 from the hybrid PLL 210, instructs the control circuit 258 to reacquire phase/frequency lock.

Figure 7:
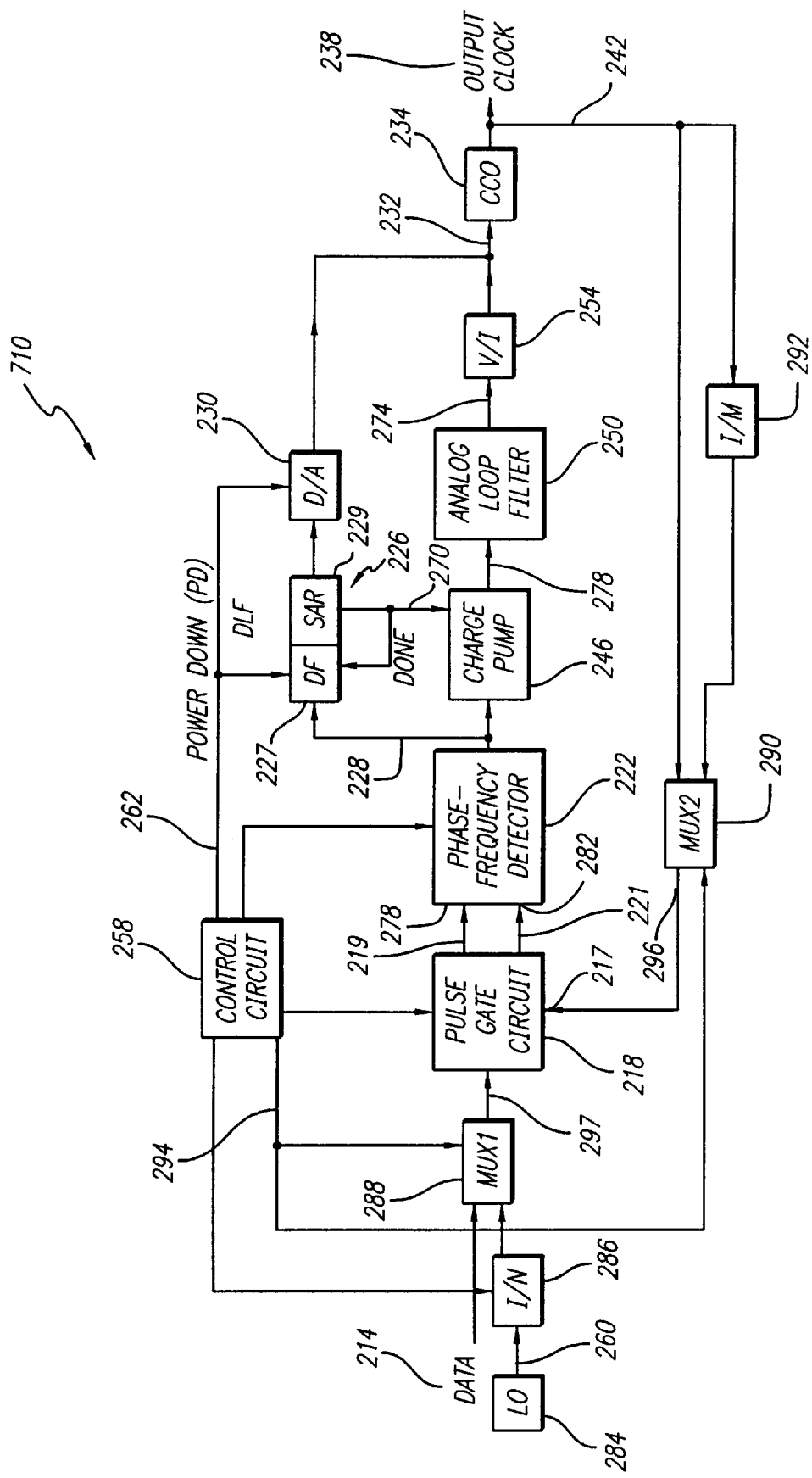
FIG. 7 is a block diagram of a hybrid PLL with separate digital and analog portions and training capability, in accordance with a preferred embodiment of the invention.

FIG. 7 is a block diagram of the hybrid PLL with training mode capability. In the training mode, the hybrid PLL functions to lock in frequency and phase to a training clock signal of a local oscillator 284 at a frequency at which the data signal 214 is expected to be clocked. The training mode allows the hybrid PLL 710 to quickly lock phase and frequency with the data signal 214 once the data signal 214 is available. Hybrid PLL 710 is a combination of hybrid PLL 210 with a local oscillator 284, dividers 286 and 292, and multiplexers 288 and 290, which provide the training capability of the hybrid PLL 710, as discussed below.

Data signal 214 is input to a multiplexer MUX1. An output of MUX1 is connected to a first input 297 of the pulse gate circuit 218. A first output 219 of the pulse gate circuit 218 connects to the first input 278 of the phase-frequency detector 222. The phase-frequency detector 222 in turn is connected to the analog and digital portions of the hybrid PLL, as described above in the context of hybrid PLL 210.

The output clock signal 238 is coupled to a multiplexer MUX2 via a feedback link 242. A feedback link 296 connects an output of MUX2 to a second input 217 of pulse gate circuit 218. A second output 221 of pulse gate circuit 218 connects to the second input 248 of phase-frequency detector 222.

To implement the training capability of hybrid PLL 710, in the training mode, the local oscillator 284 provides a training clock signal 260 to a divider 286. Divider 286 can be implemented with a counter. Preferably, divider 286 is programmable. Divider 286 is connected to MUX1. Similarly, the output clock signal 238 is connected to a divider 292. As divider 286, divider 292 preferably is programmable. Programmable dividers are discussed in Chapter 8 entitled "CMOS Subsystem Design" of the Second Edition of *Principles of CMOS VLSI Design, A System Perspective* by N. H. E. Weste & K. Eshraghiain, published by Addison-Wesley Publishing Company, 1994, which is hereby incorporated by reference. Divider 292 is connected to MUX2. The control circuit 258 provides a training control signal 294 to MUX1 and MUX2. In addition, control circuit 258 controls dividers 286, 292. So, control circuit 258 can select divisors N, M depending on the output clock signal frequency in a particular application, as further explained below.

The hybrid PLL 710 functions as follows. Initially, hybrid PLL 710 does not have frequency and phase lock with the clock signal associated with data signal 214. Lack of such lock could be due to, for instance, a sudden and extended interruption in data signal 214. As a result, without the training capability, the frequency of the output clock signal 238 of CCO 234 will tend to drift away from the frequency of the clock of data signal 214.

To prepare the hybrid PLL 710 for a resumption of transmission of data signal 214, the control circuit 258 switches MUX1 for transmitting to the phase-frequency detector 222 the training clock signal 260 of local oscillator 284 divided by divider 286. Similarly, the control circuit 258 switches MUX2 for transmitting the output clock signal 238 divided by divider 292 to phase-frequency detector 222.

To know when to switch MUX1 and MUX2, the control circuit 258 monitors data clocked with the recovered clock signal 238 and received from data link 142 (see FIG. 1). Such data typically is recovered from an output of a type D flip-flop, where the type D flip-flop is clocked with the recovered clock signal 238. Periodically, the control circuit 258 switches to the data receiving mode and monitors the recovered data for a system pattern. Once the control circuit 258 discovers the system pattern, then the control circuit 258 remains in the data receiving mode. Should the control circuit 258 not discover the system pattern in the recovered data, then the control circuit switches the hybrid PLL 710 to the training mode. Typically, the control circuit 258 is removed from the hybrid PLL 710, although, for simplicity in FIG. 7, the control circuit 258 is shown as part of hybrid PLL 710. Since the phase-frequency detector 222 attempts to equalize the frequencies and phases of signals at its inputs 278, 282 by providing an output signal that ultimately controls the CCO 234, the relationship between the frequencies of signals at inputs 278, 282 can be expressed as shown below in Equation 1:

$$f(\text{output}) = f(\text{LO})M/N \qquad (1)$$

Per Equation 1, the frequency of the output clock signal 238 equals the frequency of the training clock signal 260 of the local oscillator 284 multiplied by the divisor M of divider 292 and divided by the divisor N of divider 286. Consequently, by selecting appropriate values of divisors M, N of dividers 292, 286, respectively, the frequency of the output clock signal 238 can be made to substantially equal the frequency of the expected clock signal of the data signal 214.

Indeed, the greater the precision with which divisors M, N are provided, the closer the PLL 210 can make the frequency of the output clock signal 238 to the frequency of the clock of data signal 214. Therefore, when dividers 292, 286 are implemented with counters, then higher modulus counters will provide divisors M, N with greater precision than lower modulus counters of the same type.

Alternatively, control circuit 258 can set divisors M, N equal to one. Then the frequency of the output clock 238 is made equal to the frequency of the clock signal of data signal 214 by setting the frequency of the training clock signal 260 equal to the frequency of the clock signal of data signal 214. This approach of setting divisors M, N equal to one, however, is limited by the ability of the local oscillator 284 to provide a training clock signal 260 over the appropriate frequency range of expected clock signals of data signal 214.

So, hybrid PLL 710, in the training mode, operates to equalize the frequencies of output clock signal 238 with the expected clock signal frequency of data signal 214. Once data signal 214 again becomes available, the control circuit 258 provides the training control signal 294 that switches MUX1 and MUX2 into the data receiving mode. In the data receiving mode, the phase-frequency detector 222 receives at its first input 278 the data signal 214 with its embedded clock information. At its second input 282, the phase-frequency detector 222 receives the output clock signal 238 from the output of the CCO 234 without having been divided by divider 292.

When the hybrid PLL 710, in the training mode, had sufficient time to equalize frequencies of the clock of data 214 with the frequency of the output clock 238, then the phase-frequency detector 222 merely equalizes the phases of the embedded clock signal information of data signal 214 with that of the output clock signal 238. In this case, the hybrid PLL 710 need not waste time on equalizing frequencies. Even when frequency equalization by hybrid PLL 710 in the training mode is only partial, still partial time savings will be realized in the clock signal recovery. As discussed above, the phase-frequency detector 222 equalizes these phases by providing the appropriate voltage signal at its output.

But, while hybrid PLL 710 is in the training mode, control circuit 258 disables the pulse gate circuit 218. In the training mode, there is no need for removing pulses, since the local oscillator 284 provides at its output a continuous series of pulses in the form of the training clock signal 260.

Several preferred embodiments of the present invention have been described. Nevertheless, it will be understood that various modifications may be made without departing from the spirit and scope of the invention. For example, the discussion above has been in terms of clock signal recovery. However, it will be clear to one of ordinary skill in the art based upon the above description that in other embodiments, for example, the invention can be applied generally, i.e., whenever a fast frequency/phase-lock is desired.

Similarly, one of ordinary skill in the art will understand based on the description herein that the phase-locked loops described above can be implemented in various ways. For instance, the phase-frequency detector 222 can be replaced with a phase detector. Having a phase detector only is feasible, for example, when the frequencies of the signals at first and second inputs 278, 282 are relatively close to each other. For instance, the frequency of the signal at input 278 may be less than the frequency at input 282. But the frequency at input 282 may still be less than twice the frequency at input 278. Use of a phase detector in place of the phase-frequency detector 222 simplifies the hybrid PLL of FIG. 2. In hybrid PLL 210 of FIG. 2, the pulse gate circuit 220 can be omitted resulting in a simplified PLL. Such a simplification is illustrated, for example, in FIG. 3 of the related patent application Ser. No. 08/733,869.

In further embodiments, the CCO 234 can be replaced with a voltage-controlled oscillator. The remaining components of the hybrid PLL 210 also would be modified as appropriate. Moreover, in another embodiment, the combination of charge pump 246, analog loop filter 250, and voltage-to-current converter 254 can be replaced with a digital loop filter coupled to a digital-to-analog converter. The output of this digital-to-analog converter provides current in relatively small current increments compared to the output of the digital-to-analog converter 230. Indeed, in other embodiments, the entire phase-locked loop can be implemented in a computer program executed by, for instance, a microprocessor. Thus the present invention is not limited to the preferred embodiments described herein, but may be altered in a variety of ways, which will be apparent to a person skilled in the art based on the present description.

What is claimed is:

1. A phase-locked loop comprising:
   a detector;
   a digital loop filter coupled to the detector, the digital loop filter including a digital filter and a successive approximation register which is responsive to the digital filter;
   a digital-to-analog converter coupled to the digital loop filter;
   a variable oscillator coupled to the digital-to-analog converter; and
   an analog filter coupled between the detector and the variable oscillator, wherein the analog filter is enabled when the digital filter is disabled.

2. The phase-locked loop of claim 1,
   wherein the digital filter includes an output port and a first divider, a second divider, and a third divider, each divider coupled to the output port of the digital filter, each divider, having a reset port, the output port of the digital filter coupled to each reset port of the first, second, and third dividers,
   wherein the detector includes a first output port and a second output port, and
   wherein the first divider is coupled to the first output port of the detector, the second divider is coupled to the first and second output ports of the detector, the third divider is coupled to the second output port of the detector.

3. The phase-locked loop of claim 2, wherein the digital filter includes a delay circuit coupled between the output port of the digital filter and each reset port of the first, second, and third dividers.

4. The phase-locked loop of claim 1, wherein the variable oscillator is a current controlled oscillator, the phase-locked loop further comprising a voltage-to-current converter coupled between the filter and the current controlled oscillator.

5. The phase-locked loop of claim 1, wherein the detector comprises a phase detector.

6. The phase-locked loop of claim 1, wherein the detector comprises a phase-frequency detector, the phase-locked loop further comprising a pulse gate coupled between the phase-frequency detector and the variable oscillator.

7. The phase-locked loop of claim 1, wherein the filter is an analog filter, the phase-locked loop further comprising a charge pump coupled between the detector and the analog filter.

8. The phase-locked loop of claim 1, further comprising:
   a first multiplexer coupled to the detector, the multiplexer including a data port and a training port;
   a second multiplexer coupled between the detector and the variable oscillator, the second multiplexer having a first input and a second input, the first input of the second multiplexer coupled to the variable oscillator;
   a first divider coupled to the training port of the first multiplexer; and
   a second divider coupled between the variable oscillator and the second input port of the second multiplexer.

9. The phase-locked loop of claim 1, further comprising a control circuit coupled to the detector, to the digital loop filter, and to the digital-to-analog converter.

10. A method for acquiring phase-lock comprising the steps of:
    coupling a data signal to a detector;
    coupling an output signal to the detector;
    comparing the phase of the data signal with the phase of the output signal;
    generating a comparison signal based on the phase comparison of the data signal and the output signal;
    providing an analog filter coupled to the detector to receive the comparison signal;
    providing a digital filter coupled to the detector to receive the comparison signal;
    transforming the comparison signal into a successive digital approximation signal, wherein the successive approximation signal is maintained at a level which disables the analog filter when the digital filter is enabled; and
    transforming the comparison signal into a fine adjustment signal.

11. The method of claim 10, wherein the digital approximation signal is a current ranging between approximately 50 and 500 micro-amperes.

12. The method of claim 10, wherein the step of transforming into a fine adjustment signal includes transforming into an analog signal.

13. The method of claim 12, wherein the analog signal is a current of approximately up to 50 micro-amperes.

14. The method of claim 10, wherein the step of transforming the comparison signal into a digital approximation signal includes the step of counting the times when the output signal lags in phase behind the data signal and the times that the output signal is ahead in phase of the data signal.

15. A program storage device readable by a machine for communicating with a detector for coupling a data signal, tangibly embodying a program of instructions executable by the machine to perform method steps for acquiring phase-lock, said method steps comprising:

coupling a data signal to a detector;

coupling an output signal to the detector;

comparing the phase of the data signal with the phase of the output signal;

generating a comparison signal based on the phase comparison of the data signal and the output signal;

coupling an analog filter to the detector to receive the comparison signal;

coupling a digital filter to the detector to receive the comparison signal;

transforming the comparison signal into a successive digital approximation signal, wherein the successive approximation signal is maintained at a level which disables the analog filter when the digital filter is enabled; and transforming the comparison signal into a fine adjustment signal.

16. An apparatus for acquiring phase-lock comprising:

means for coupling a data signal to a detector;

means for coupling an output signal to the detector;

means for comparing the phase of the data signal with the phase of the output signal;

means for generating a comparison signal based on the phase comparison of the data signal and the output signal;

an analog filter means coupled to the detector for filtering the comparison signal;

a digital filter means coupled to the detector for filtering the comparison signal;

means for transforming the comparison signal into a successive digital approximation signal, wherein the successive approximation signal is maintained at a level which disables the analog filter means when the digital filter means is enabled; and means for transforming the comparison signal into a fine adjustment signal.

17. An apparatus according to claim 16, in which the means for transforming the comparison signal to the successive digital approximation signal includes a digital filter and a successive approximation register which is responsive to the digital filter.

18. A phase-locked loop comprising:

a phase-frequency detector;

a digital loop filter coupled to the phase-frequency detector including a digital filter and a successive approximation register, the successive approximation register being responsive to the digital filter;

a digital-to-analog converter coupled to the digital loop filter;

a variable oscillator coupled to the digital-to-analog converter, wherein the digital filter commands the successive approximation register to produce a successive digital approximation signal for controlling the variable oscillator; and an analog filter coupled to the phase-frequency detector and to the variable oscillator, wherein the analog filter is enabled when the digital filter is disabled.

19. A phase-locked loop according to claim 18, the phase-locked loop further including a control circuit coupled to the digital loop filter and the digital-to-analog converter, the control circuit being responsive to the phase-frequency detector, wherein the digital loop filter and the digital-to-analog converter are activated by the control circuit when the phase-locked loop is in calibration mode and when the phase-locked loop loses phase-frequency lock.

20. A method for acquiring phase-lock comprising the steps of:

coupling a data signal to a detector;

coupling an output signal to the detector;

comparing the phase of the data signal with the phase of the output signal;

generating a comparison signal based on the phase comparison of the data signal and the output signal;

analog filtering the comparison signal with an analog filter;

digitally filtering the comparison signal with a digital filter;

transforming the digitally filtered comparison signal into a successive digital approximation signal, wherein the successive approximation signal is maintained at a level that disables the analog filter when the digital filter is enabled; and transforming the comparison signal into a fine adjustment signal, wherein each of the successive digital approximation signal and the fine adjustment signal control a variable oscillator for producing the output signal.

* * * * *